United States Patent [19]

Furutani et al.

[11] Patent Number: 4,858,193
[45] Date of Patent: Aug. 15, 1989

[54] PREAMPLIFICATION METHOD AND APPARATUS FOR DRAM SENSE AMPLIFIERS

[75] Inventors: Kiyohiro Furutani; Kazutami Arimoto, both of Hyogo, Japan

[73] Assignee: Mitsubishi Denki Kabushiki Kaisha, Tokyo, Japan

[21] Appl. No.: 212,058

[22] Filed: Jun. 23, 1988

[30] Foreign Application Priority Data

Jun. 23, 1987 [JP] Japan ................... 62-157054

[51] Int. Cl.[4] .................. G11C 13/00; G11C 11/40
[52] U.S. Cl. ........................ 365/203; 365/207; 307/530
[58] Field of Search ........... 365/149, 150, 203, 207, 365/206, 222; 307/530

[56] References Cited

U.S. PATENT DOCUMENTS 4,025,907  5/1977  Karp et al. ............... 365/203

OTHER PUBLICATIONS

International Solid-State Circuits conference Digest of Technical Papers, "A Sense-Signal Doubling Circuit for DRAMs" by Kraus Rainer, pp. 16-17.

Primary Examiner—Terrell W. Fears
Attorney, Agent, or Firm—Lowe, Price, LeBlanc, Becker & Shur

[57] ABSTRACT

A preamplifier is provided between a sense amplifier and a memory cell array at each bit line pair lead from a memory cell array. The preamplifier amplifies a potential difference between bit lines at the time of reading information from the memory cell and outputs the same to the sense amplifier. More specifically, the preamplifier charges a step-up capacitor and a step-down capacitor connected in parallel between the bit lines, and then connects these step-up capacitor and step-down capacitor to one input terminal of the sense amplifier in a positive direction and to the other input terminal in a negative direction, respectively. As a result, a potential of the one bit line is boosted and a potential of the other bit line is dropped.

5 Claims, 6 Drawing Sheets

1 MEMORY CELL ARRAY

7 SENSE AMPLIFIER

MEMORY ARRAY | PREAMPLIFIER | SENSE AMPLIFIER $f = \dfrac{C_P}{C_P + C_{SA}}$
($C_{SA}$: PARASTIC CAPACITANCE)

PREAMPLIFICATION METHOD AND APPARATUS FOR DRAM SENSE AMPLIFIERS

BACKGROUND OF THE INVENTION

FIELD OF THE INVENTION

The present invention relates generally to semiconductor memory devices and, more particularly, to increasing the potential difference between bit lines of a DRAM during reading of data therefrom.

Description of the Prior Art

FIG. 1 is a circuit diagram showing a conventional semiconductor memory device having a folded bit line structure. A semiconductor memory device of a folded bit line structure is described in, for example, U.S. Pat. No. 4,025,907.

A memory cell array 1 comprises a plurality of memory cells 2a, 2b etc. The memory cell array 1 further comprises a plurality of bit lines 5a, 5b etc. and a plurality of word lines 6a, 6b etc., both lines being arranged in a crossed manner at right angles with each other. Each memory cell is arranged on each of connection points between these bit lines and word lines. For example, the memory cell 2a comprises a capacitor 3a and an Nch (N channel)-MOSFET 4a and is connected to a first bit line 5a and a word line 6a. The memory cell 2b comprises a capacitor 3b and an Nch-MOSFET 4b and is connected to a second bit line 5b and a word line 6b. The first bit line 5a and the second bit line 5b constitute a folded bit line pair and it is always precharged at the same potential $\frac{1}{2}$ Vcc at an initial stage of reading/rewriting operation. In addition, other bit lines (not shown) in the memory array 1 also constitute folded bit line pairs with adjacent bit lines as described above.

A sense amplifier 7 is connected between the first bit line 5a and the second bit line 5b and comprises a first latch circuit 9 comprising an Nch-MOSFET's 8a and 8b connected in series and a second latch circuit 11 comprising Pch (P channel)-MOSFET's 10a and 10b connected in series. In this case, the Nch-MOSFET 8a is provided between a terminal 12 to which a clock signal $\phi 1$ is applied and the first bit line 5a, and the Nch-MOSFET 8b is inserted between the terminal 12 and the second bit line 5b. The Pch-MOSFET 10a is provided between a terminal 13 to which a clock signal $\phi 2$ is applied and the first bit line 5a, and the Pch-MOSFET 10b is provided between the terminal 13 and the second bit line 5b. The gate of the Nch-MOSFET 8a is connected to the gate of the Pch-MOSFET 10a and a connection point thereof is connected to the second bit line 5b. The gate of the Nch-MOSFET 8b is connected to the gate of the Pch-MOSFET 10 and a connection point thereof is connected to the first bit line 5a. Although not shown in FIG. 1, other folded bit lines in the memory cell array 1 are provided with the same amplifiers 7 as described above.

Now, a description is made of operation of reading/rewriting in the conventional semiconductor memory device.

Assuming that a potential $V_D$ is maintained in the capacitor 3a of the memory cell 2a, a description is made as to a case in which its contents are read out. In the following description, a threshold voltage of each of Nch-MOSFET's 8a and 8b is represented as $V_{thN}$ and a threshold voltage of each of Pch-MOSFET's 10a and 10b is represented as $V_{thP}$.

(1) First, the first bit line 5a and the second bit line 5b are precharged at $\frac{1}{2}$ $V_{CC}$. At this time, the clock signal $\phi 1$ inputted to the terminal 12 is represented by the following equation: $\phi_1 = \frac{1}{2} V_{CC} - V_{thN}$, and the clock signal $\phi 2$ inputted to the terminal 13 is represented by the following equation: $\phi_2 = \frac{1}{2} V_{CC} + |V_{thP}|$. At this time, a potential difference between the gate of the Nch-MOSFET 8a and the terminal 12 is represented by the following equation: $\frac{1}{2} V_{CC} - (\frac{1}{2} V_{CC} - V_{thN}) = V_{thN}$, and a potential difference between the gate of the Nch-MOSFET 8b and the terminal 12 is represented by the following equation: $\frac{1}{2} V_{CC} - (\frac{1}{2} V_{CC} - V_{thN}) = V_{thN}$. A potential difference between the gate of the Pch-MOSFET 10a and the terminal 13 is represented by the following equation: $\frac{1}{2} V_{CC} - (\frac{1}{2} V_{CC} + |V_{thP}|) = -|V_{thP}|$, and a potential difference between the gate of the Pch-MOSFET 10b and the terminal 13 is represented by the following equation: $\frac{1}{2} V_{CC} - (\frac{1}{2} V_{CC} + |V_{thP}|) = -|V_{thP}|$. The Nch-MOSFET's 8a and 8b and Pch-MOSFET's 10a and 10b are all OFF.

(2) When the word line 6a rises to "H" level, a potential of the first bit line 5a changes by the following value:

$$V = \frac{V_D - \frac{1}{2} V_{CC}}{1 + C_B/C_S} \quad (1)$$

where $C_B$ is a stray capacitance of the first bit line 5a and $C_S$ is a capacitance of the capacitor 3a. More specifically, a potential of the capacitor 3a and a potential of the first bit line 5a are balanced and a potential of the first bit line 5a changes from $\frac{1}{2}$ $V_{CC}$ to ($\frac{1}{2}$ $V_{CC} + \Delta V$). Since $\Delta V > 0$ when $V_D > \frac{1}{2}$ $V_{CC}$, e.g., $V_D = V_{CC}$, a potential of the first bit line 5a rises up to ($\frac{1}{2}$ $V_{CC} + \Delta V$), while a potential of the second bit line 5b remains at $\frac{1}{2}$ $V_{CC}$.

At this time, since a gate potential of the Nch-MOSFET 8a is a potential $\frac{1}{2}$ $V_{CC}$ of the second bit line 5b and a potential of the clock signal $\phi 1$ is ($\frac{1}{2}$ $V_{CC} - V_{thN}$), a potential difference between the gate of the Nch-MOSFET 8a and the terminal 12 is represented by $\frac{1}{2}$ $V_{CC} - (\frac{1}{2} V_{CC} - V_{thN}) = V_{thN}$. In addition, since a gate potential of the Nch-MOSFET 8b is equal to a potential ($\frac{1}{2}$ $V_{CC} + \Delta V$) of the first bit line 5, a potential difference between its gate and the terminal 12 is represented by the following equation: ($\frac{1}{2}$ $V_{CC} + \Delta V) - (\frac{1}{2} V_{CC} - V_{thN}) = \Delta V + V_{thN}$. Meanwhile, since a gate potential of the Pch-MOSFET 10a is equal to the potential $\frac{1}{2}$ $V_{CC}$ of the second bit line 5b and a potential of the clock signal $\phi 2$ is ($\frac{1}{2}$ $V_{CC} + |V_{thP}|$, a potential difference between its gate and the terminal 13 is represented by the following equation: $\frac{1}{2}$ $V_{CC} - (\frac{1}{2} V_{CC} + |V_{thP}|) = -|V_{thP}|$. In addition, since a gate potential of the Pch-MOSFET 10b is equal to the potential of the first bit line 5a of ($\frac{1}{2}$ $V_{CC} + \Delta V$), a potential difference between its gate and the terminal 13 is represented by the following equation: ($\frac{1}{2}$ $V_{CC} + \Delta V) - (\frac{1}{2} V_{CC} + |V_{thP}| = \Delta V - |V_{thP}|$.

(3) When a potential of the clock signal $\phi 1$ falls from ($\frac{1}{2}$ $V_{CC} - V_{thN}$) to 0 V and a potential of the clock signal $\phi 2$ rises from ($\frac{1}{2}$ $V_{CC} + |V_{thP}|$) to $V_{CC}$ immediately after the operation described above in (2), the Nch-MOSFET 8b is conducted more heavily than the Nch-MOSFET 8a because of the relation between a source-gate voltage of the Nch-MOSFET 8a and a source-gate voltage of the Nch-MOSFET 8b as described in (2), while the Pch-MOSFET 10a is conducted more heavily than the Pch-MOSFET 10b because of the relation between a source-gate voltage of the Pch-MOSFET 10a and a source-gate voltage of the Pch-MOSFET 10b. As a result, the second bit line 5b is discharged to 0 V through the Nch-MOSFET 8b, while the first bit line 5a is charged at the supply potential $V_{CC}$ through the Pch-MOSFET 10a.

As described above, since the potential of the second bit line 5b becomes 0 V and the potential of the first bit line 5a rises to $V_{CC}$, a potential difference between both bit lines 5a and 5b increases from $\Delta V$ to $V_{CC}$ and, as a result, a high voltage is outputted from the sense amplifier 7.

On the other hand, since the potential of the first bit line 5a has risen to $V_{CC}$, a potential of the capacitor 3a of the memory cell 2a returns to the initial potential of $V_{CC}$. More specifically, although the potential of the capacitor 3a falls from $V_D=V_{CC}$ to ($\frac{1}{2} V_{CC}+\Delta V$) at the initial stage, during which the word line 6a rises to "H" level to read the memory cell 2a, a potential of this capacitor 3a returns to the initial potential $V_{CC}$ again by the function of the sense amplifier 7 and rewriting operation is performed to hold the storage contents.

Almost the same operation as the above is performed even while "0" has been held as the potential $V_D$ of the capacitor 3a of the memory cell 2a. However, when $V_D=0$, the potential of the first bit line 5a falls from $\frac{1}{2} V_{CC}$ by $\Delta V$ by reading the memory cell 2a. Meanwhile, the potential of the second bit line 5b remains at $\frac{1}{2} V_{CC}$. As a result, if the potential of the clock signal $\phi 1$ falls from ($\frac{1}{2} V_{CC}-V_{thN}$) to 0 V and the potential of the clock signal $\phi 2$ is boosted from ($\frac{1}{2} V_{CC}+|V_{thP}|$) to $V_{CC}$, the Nch-MOSFET 8a is conducted more heavily than the Nch-MOSFET 8b while Pch-MOSFET 10b is conducted more heavily than the Pch-MOSFET 10a contrary to the above described case. Consequently, the first bit line 5a is discharged to 0 V through the Nch-MOSFET 8a and the second bit line 5b is charged up to the supply potential $V_{CC}$ through the Pch-MOSFET 10b. Thus, potentials of both bit lines 5a and 5b is held from $\Delta V$ to $V_{CC}$ by the sense amplifier 7 and outputted. In addition, when the first bit line 5a returns to 0 V, rewriting operation of the memory cell 2a is performed and 0 V is held in the capacitor 3a.

In the above described conventional semiconductor memory device, initial operation is performed utilizing the fact that gate-source potentials of the two Nch-MOSFET's 8a and 8b constituting the latch circuit 9 and those of the two Pch-MOSFET's 10a and 10b constituting the latch circuit 11 are different by $\Delta V$, at the initial operational stage of the sense amplifier 7, that is, conductance of the drains of the pair of MOSFET's are different at that stage. Therefore, to prevent malfunction of the sense amplifier 7, it is necessary to assure a potential difference between the bit lines (represented as $\Delta V$ in the above example) larger than a predetermined value, as a potential difference to be applied to the sense amplifier 7.

However, when a semiconductor memory device is integrated on a large scale and an area of a cell is reduced, the capacitance $C_S$ of the capacitor is reduced or the number of the memory cells connected to the bit lines is increased and the stray capacitance $C_B$ of a bit line is increased. As a result, the potential difference between the bit lines represented by the above (1) equation:

$$\Delta V = \frac{V_D - \frac{1}{2} V_{CC}}{1 + C_B/C_S}$$

is reduced. In this case, in order to obtain the predetermined potential difference between bit lines $\Delta V$, it is conventionally necessary to use a memory cell of a three-dimensional structure as a memory cell, to increase the capacitor capacitance $C_S$ by making a trench of the capacitor deeper and to reduce the stray capacitance $C_B$ of a bit line by dividing a memory cell array to shorten the length of the bit line.

However, there are disadvantages that a manufacturing process will be more complicated if a deep trench is formed in a semiconductor chip to be a capacitor and that a chip area will be increased because it is necessary to provide a sense amplifier at every divided section of the array if the memory cell array is divided.

A semiconductor memory device capable of solving the above described problem is disclosed in 1987 IEEE International Solid-State Circuits Conference DIGEST OF TECHNICAL PAPERS "A Sense-Signal Doubling Circuit for DRAMs" by Kraus Rainer, pp. 16–17. In this semiconductor memory device, a preamplifier is interposed between the memory array and the sense amplifier, as shown in FIG. 2, and the potential difference between bit lines is amplified by the preamplifier before the operation of the sense amplifier. More specifically, at first, two capacitors $C_P$ included in the preamplifier are connected in parallel between the bit lines BL and $\overline{BL}$ as shown in FIG. 3A and, they are charged by the potential difference $\Delta V_O$ between the bit lines. Thereafter, each of the two capacitors $C_P$ is connected in series to the bit line BL and to the bit lines $\overline{BL}$, respectively. On this occasion, one capacitor $C_P$ is connected in the direction to increase the voltage of the bit line BL, while the other capacitor $C_P$ is connected in the direction to decrease the voltage of the bit line $\overline{BL}$. Therefore, the voltage on the bit line BL is increased by approximately $\Delta V_O$ (to be exact, $f \Delta V_O$) from the initial potential, while the voltage on the bit line $\overline{BL}$ is decreased by approximately $\Delta V_O$ (to be exact, $f \Delta V_O$) from the initial potential. Consequently, the potential difference between the bit lines BL and $\overline{BL}$ is increased from the initial value of $\Delta V_O$ to approximately 3 $\Delta V_O$ (to be exact, $\Delta V_O + 2 f \Delta V_O$), where $$f = \frac{C_P}{C_P + C_{SA}},$$

and $C_{SA}$ is the stray capacitance of the bit line.

However, in the semiconductor memory device disclosed in the prior art, when we consider the operation with reference to the precharge potential $V_P$, a potential of one bit line BL is boosted from a precharge potential of $V_P$ by 2 $\Delta V_O$ and a potential of the other bit line BL drops from the precharge potential $V_P$ by $\Delta V_O$. Consequently, assuming that the precharge potential $V_P$ is a reference potential, an imbalance of potential between the bit lines BL and $\overline{BL}$ occurs. This requires that a difference of sensitivity should be given between the first latch circuit 9 comprising Nch-MOSFET's and the second latch circuit 11 comprising Pch-MOSFET's when a CMOS type sense amplifier as shown in FIG. 1 for example is employed as a sense amplifier. As a result, a manufacturing process of the sense amplifier becomes complicated. However, if the difference of sensitivity is not given, the first latch circuit 9 and the second latch circuit 11 do not start to operate at the same time, causing sense operation to be late.

SUMMARY OF THE INVENTION

An object of the present invention is to improve reliability of read out in DRAM.

Another object of the present invention is to increase the potential difference applied to a sense amplifier of a DRAM for more reliable data read out therefrom.

A further object of the present invention is to increase the potential difference applied to a sense amplifier of a DRAM to provide more reliable read out of data therefrom without increasing cell storage capacitance.

A still further object of the present invention is to increase the potential difference applied to a sense amplifier of a DRAM to provide more reliable read out of data therefrom, without requiring reduce of bit line stray capacitance thereof.

A still further object of the present invention is to provide a DRAM having an improved bit line voltage preamplifier, wherein bit line voltage applied to the sense amplifier is amplified symmetrically.

A still further object of the present invention is to provide in a DRAM sense amplification that is high in speed and low in reading errors.

Briefly stated, the present invention includes a preamplifier as well as a sense amplifier provided between first and second bit lines of each bit line pair lead from a memory cell array. Each preamplifier serves to amplify a potential difference produced between the two bit lines at the time of applying a reading signal to a memory and to output it to the corresponding sense amplifier. Each preamplifier comprises a step-up capacitor for raising a potential of the first bit line, a step-down capacitor for lowering a potential of the second bit line, first switching means for connecting the respective step-up and step-down capacitors between the first bit line and the second bit line, and second switching means for connecting the step-up capacitor to one input terminal of the sense amplifier in series in a positive direction and also for connecting the step-down capacitor to the other input terminal of the sense amplifier in series in a negative direction. In addition, the total number of the above described step-down capacitors is selected to be two times as many as that of the above described step-up capacitors.

In the present invention, at the time of applying the reading signal, the step-up capacitor is charged in the positive direction and the step-down capacitor is charged in the negative direction in the preamplifier. The charged step-up capacitor is connected to one input terminal of the sense amplifier in the positive direction to raise a potential of that input terminal of the sense amplifier by a value corresponding to the charged voltage of the step-up capacitor and the charged step-down capacitor is connected to the other input terminal of the sense amplifier in the negative direction to lower a potential of the other input terminal of the sense amplifier by a value corresponding to the charged voltage of the step-down capacitor.

More specifically, since the voltage of the one input terminal of the sense amplifier is raised and also the voltage of the other input terminal is lowered, a large potential difference is provided across the sense amplifier. Thus, the potential difference across the sense amplifier is remarkably increased as compared with a conventional example. Therefore, even if a cell area is small due to a large scale of integration, a potential difference larger than a predetermined value can be obtained as a potential difference to be applied to the sense amplifier without using means for increasing capacitor capacitance or reducing bit line stray capacitance. Furthermore, since the number of step-down capacitors is selected to be two times as many as that of step-up capacitors, a change amount for raising the potential of one bit line of a pair is substantially equal to that for lowering the potential of the other bit line of the pair if a precharge potential of the bit lines is regarded as the center. As a result, even if the sense amplifier is of a CMOS structure, sensing operation can be performed at high speed without providing a sensitivity difference inside the sense amplifier.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
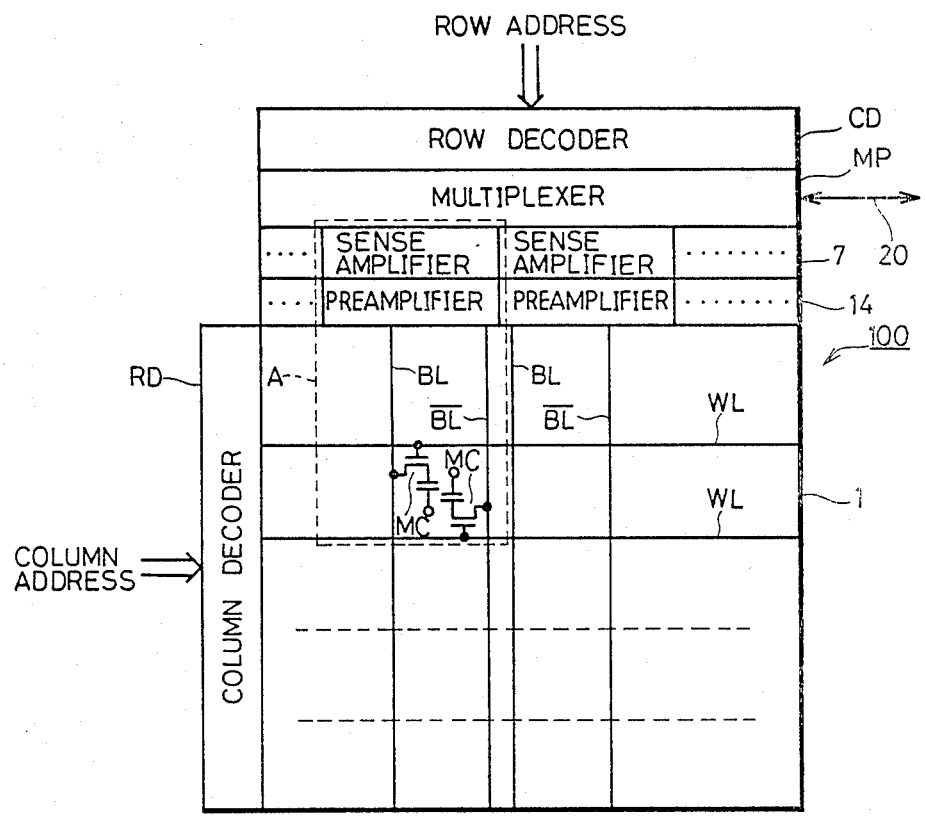
FIG. 4 is shows the whole structure of the DRAM employing one embodiment of the present invention.

FIG. 4 shows the whole structure of a DRAM to which one embodiment of the present invention is applied. Referring to the figure, the DRAM 100 comprises a memory cell array 1, a row decoder RD, a sense amplifier 7, a preamplifier 14, a multiplexer MP, and a column decoder CD. In the memory cell array 1, a plurality of word lines WL and a plurality set of bit line pairs BL, $\overline{BL}$ are arranged crossing with each other, and memory cells are arranged at respective intersections. The row decoder RD selects one out of a plurality of word lines WL corresponding to the inputted row address. The sense amplifier 7 is provided for each bit line pair BL, $\overline{BL}$ and amplifies the potential difference generated at each bit line pair in data reading or writing. A preamplifier 14 is provided for each sense amplifier 7. The preamplifier 14 amplifies the bit line voltage applied to each sense amplifier 7 before the operation of the sense amplifier. The multiplexer MP comprises a plurality of I/O switches provided for each of the bit lines BL and $\overline{BL}$, each I/O switch being commonly connected to the I/O line 20. The column decoder CD selects a desired bit line pair BL and $\overline{BL}$ by selectively opening/closing the said I/O switch based on the inputted column address. As is well known, the data writing and reading can be carried out at any time to and from an arbitrary memory cell MC in such DRAM 100.

Figure 5:
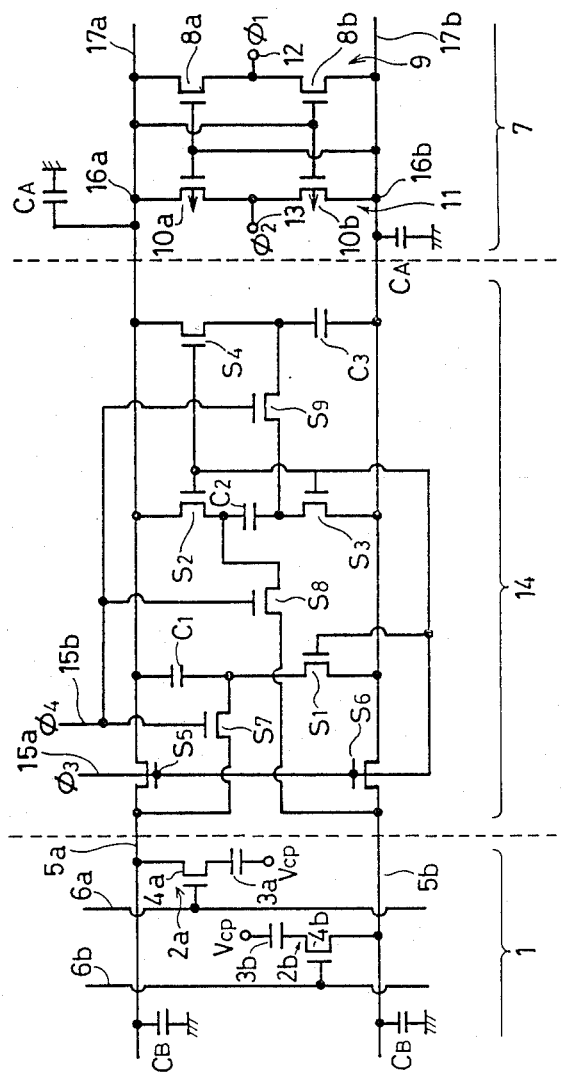
FIG. 5 is a detailed diagram of the portion A surrounded by a dotted line, which is the characteristic portion of the embodiment in the DRAM shown in FIG. 4.

FIG. 5 is a schematic diagram of a portion A surrounded by a dotted line, extracted from the DRAM shown in FIG. 4, which portion is the characteristic portion of this embodiment.

Figure 1:
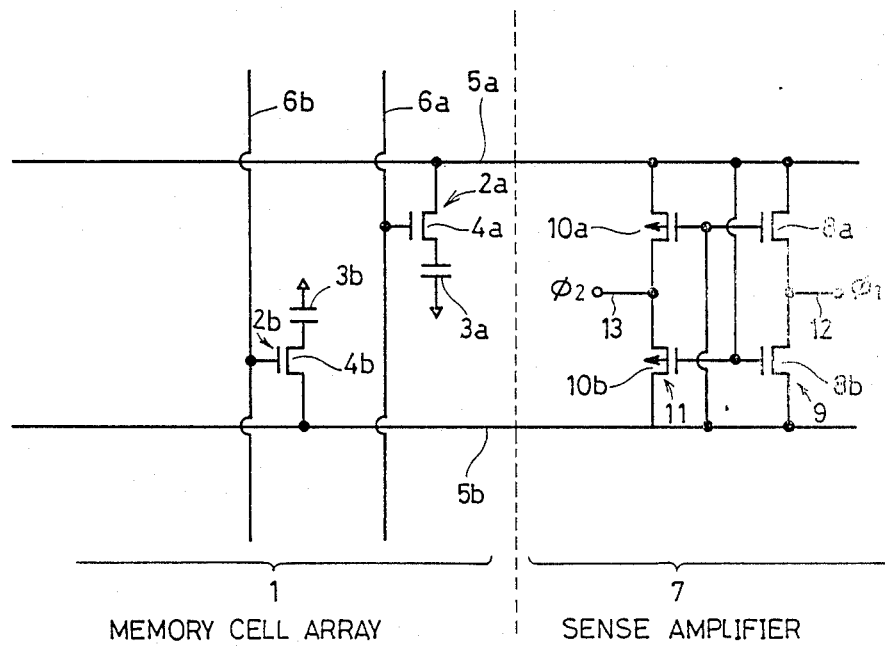
FIG. 1 is a circuit diagram showing one example of a conventional semiconductor memory device.
Figure 2:
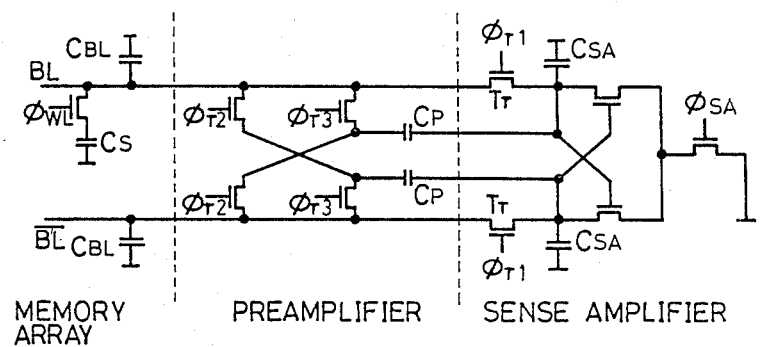
FIG. 2 is a schematic diagram showing another example of a conventional semiconductor memory device.
Figure 3A:
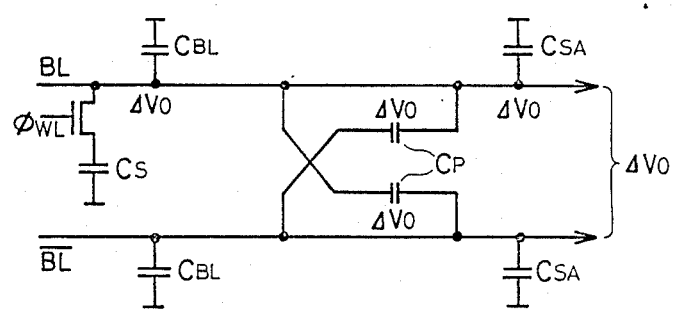
FIGS. 3A and 3B show the states of operation of the semiconductor memory device shown in FIG. 2.
Figure 3B:
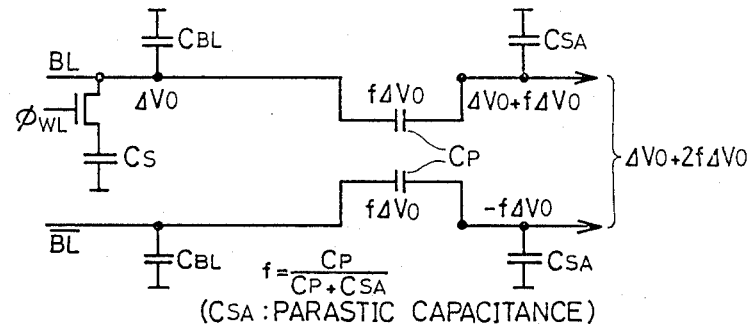

In FIG. 5, the same references as in FIG. 1 in connection with the conventional example represent the same parts and portions in this embodiment. In addition, arrangements and connections in this embodiment are also the same as in the above described conventional example unless otherwise specified. This embodiment has a difference in structure from the conventional example as described below.

A preamplifier 14 is provided between a memory cell array 1 and a sense amplifier 7, which preamplifier 14 amplifies a potential difference $\Delta V$ generated between a first bit line 5a and a second bit line 5b at time of applying a reading signal to any memory cell in the memory cell array 1 and outputs the same to the sense amplifier 7. In addition, other folded bit line pairs not shown in FIG. 5 are also provided with the same preamplifier 14.

The preamplifier 14 has the following structure. The preamplifier 14 comprises: a step-up capacitor C1 for raising a potential of the first bit line 5a; two step-down capacitors C2 and C3 for lowering a potential of the second bit line 5b; a first switching device S1 connected in series with the capacitor C1 and interposed between the first bit line 5a and the second bit line 5b; second and third switching devices S2 and S3 connected in series with the step-down capacitor C2 and interposed between the two bit lines 5a and 5b; a fourth switching device S4 connected in series with the step-down capacitor C3 and interposed between the two bit lines 5a and 5b; fifth and sixth switching devices S5 and S6 interposed between the first bit line 5a and the second bit line 5b for connecting and cutting off the memory cell array 1 to and from the preamplifier 14; a seventh switching device S7 interposed between a connection point between the memory cell 2a and the fifth switching device S5, and a negative terminal of the step-up capacitor C1; an eighth switching device S8 interposed between a connection point between the memory cell 2b and the sixth switching device S6, and a positive terminal of the step-down capacitor C2; and a ninth switching device S9 interposed between a negative terminal of the step-down capacitor C2 and a positive terminal of the step-down capacitor C3. The first through ninth switching devices S1 to S9 each comprise an Nch-MOSFET.

The respective gates of the first to sixth switching devices S1 to S6 are connected to a control line 15a to which a clock signal $\phi 3$ is inputted and the respective gates of the seventh to ninth switching devices S7 to S9 are connected to a control line 15b to which a clock signal $\phi 4$ is inputted.

Referring to the FIG. 5, the sense amplifier 7 comprises first and second input terminals 16a and 16b, and first and second output terminals 17a and 17b. The first and second bit lines 5a and 5b on the memory cell array 1 have a stray capacitance $C_B$. The sense amplifier 7 has an input capacitance $C_A$. The stray capacitance $C_B$ of the bit lines 5a and 5b is sufficiently large as compared with the capacitance of each of the step-up capacitor C1 and the step-down capacitors of the step-down capacitors C2 and C3, and the input capacitance $C_A$ of the sense amplifier 7 is sufficiently small as compared with the capacitance of each of the step-up capacitor C1 and the step-down capacitors C2 and C3.

Since the other structure is the same as that of the conventional example, a description thereof is omitted.

A description is now made of operation of the semiconductor memory device.

Operation of the memory cell array 1 and the sense amplifier 7 is basically the same as in the previously described conventional device.

Figure 6A:
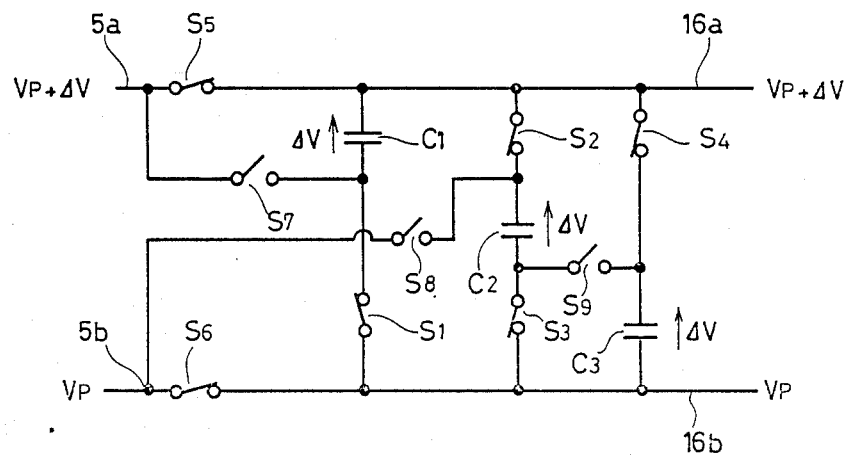
FIGS. 6A and 6B are diagrams showing states of operation of a preamplifier 14 shown in FIG. 5.
Figure 6B:
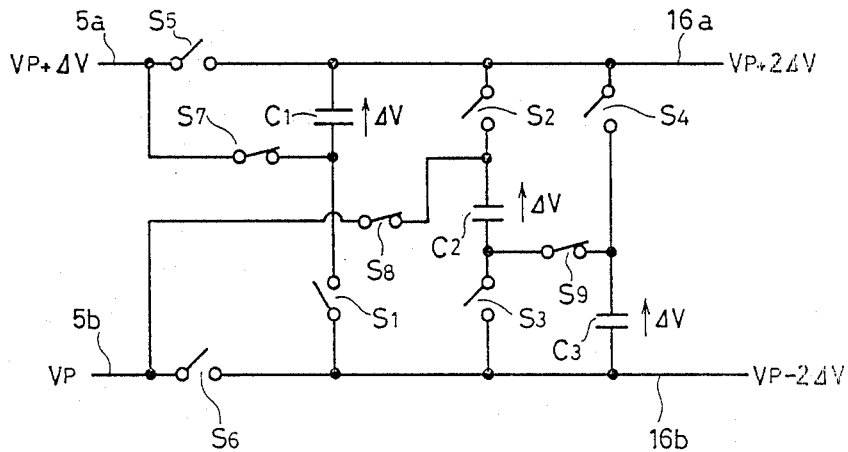
Figure 7:
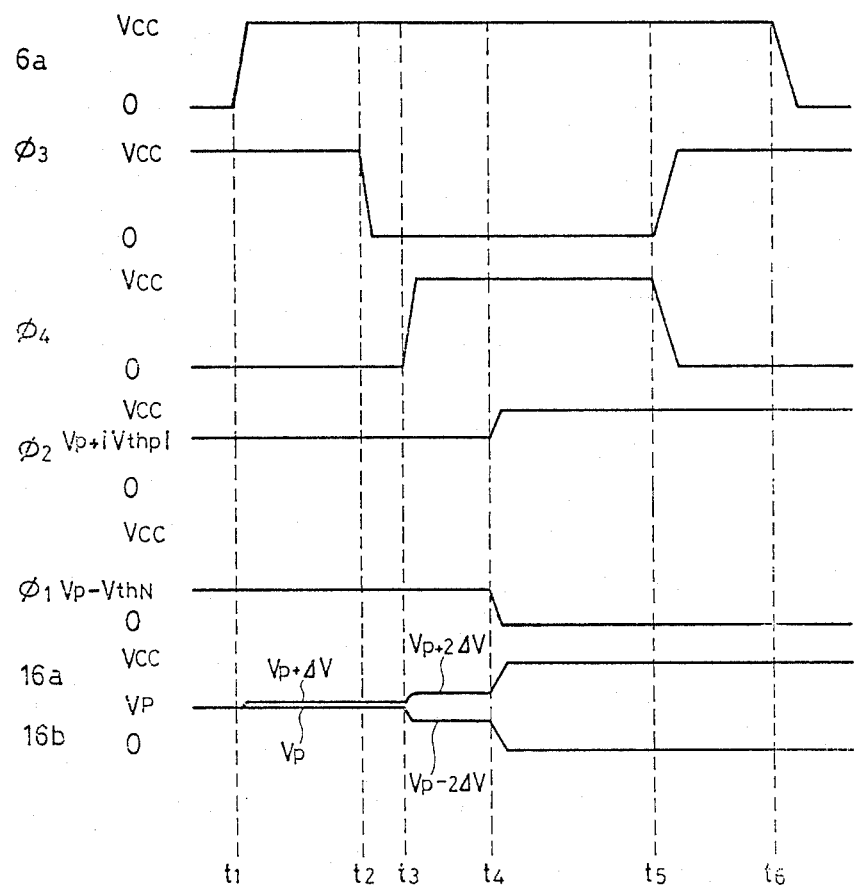
FIG. 7 is a timing chart for explaining operation of the embodiment shown in FIG. 5.

Referring to FIGS. 6A, 6B and 7, a description is made of operation of the preamplifier 14 in the semiconductor memory device. FIGS. 6A and 6B are diagrams for explaining operation of the preamplifier 14 and FIG. 7 is a time chart of the operation.

Assuming that a potential $V_D$ is stored in a memory cell 2a and a capacitor 3a, a description is made of a case where the contents is read. Let it be assumed that a threshold voltage of each Nch-MOSFET is $V_{thN}$ and a threshold voltage of each Pch-MOSFET is $V_{thP}$.

(1) First, a first bit line 5a and a second bit line 5b are precharged up to $V_P$ (for example $\frac{1}{2} V_{CC}$). At this time, a clock signal $\phi 1$ inputted to a terminal 12 is $\phi 1 = \frac{1}{2} V_{CC} - V_{thN}$ and a clock signal $\phi 2$ inputted to a terminal 13 is $\phi 2 = \frac{1}{2} V_{CC} + |V_{thP}|$. At this time, the Nch-MOSFET's 8a and 8b and Pch-MOSFET's 10a and 10b are all off.

(2) At time t1, the word line 6a is raised to a high ("H") level and information stored in the capacitor 3a is read. At this time, the clock signal $\phi 3$ is at "H" level, so that as shown in FIG. 6A, the first to sixth switching devices S1 to S6 of Nch-MOSFET's are conductive. On the other hand, the clock signal $\phi 4$ is at a low ("L") level, so that the seventh to ninth switching devices S7 to S9 are non-conductive.

By the above-mentioned reading operation, potentials of the first bit line 5a and the first input terminal 16a of the sense amplifier 7 are changed from $V_P$ to $V_P + \Delta V$. On the other hand, potentials of the first bit line 5b and the second input terminal 16b of the sense amplifier 7 remains at $V_P$. The positive terminal of the step-up capacitor C1 is connected to the first bit line 5a through the fifth switching device S5 and the negative terminal thereof is connected to the second bit line 5b through the first switching device S1 and the sixth switching device S6. Therefore, when the potential of the first bit line 5a is changed to $V_P + \Delta V$, the step-up capacitor C1 is charged with the potential difference $\Delta V$ since the potential of the second bit line 5b is $V_P$ with a relation of $C_A <$ capacitance of the step-up capacitor C1 $< C_B$ being set.

The positive terminal of the step-down capacitor C2 is connected to the first bit line 5a through the second switching device S2 and the the fifth switching device S5 and the negative terminal thereof is connected to the second bit line 5b through the third switching device S3 and the sixth switching device S6. Therefore, the step-down capacitor C2 is also charged with the potential difference $\Delta V$ between the bit lines.

The positive terminal of the step-down capacitor C3 is connected to the first bit line 5a through the fourth switching device S4 and the fifth switching device S5 and the negative terminal thereof is connected to the second bit line 5b through the sixth switching device S6. Therefore, the step-down capacitor C3 is also charged with the potential difference $\Delta V$ between the bit lines.

(3) At time t2, the clock signal $\phi 3$ becomes "L" level. At this time, the clock signal $\phi 4$ is also at "L" level, so that all the switching devices S1 to S9 are non-conductive.

(4) At time t3, if only the clock signal $\phi 4$ is raised to "H" level, as shown in FIG. 6B, the seventh to ninth switching devices S7 to S9 are rendered conductive. By conduction of the seventh switching devices 7, the first output terminal 16a of the sense amplifier 7 is connected in series with the first bit line 5a through the step-up capacitor C1 and the seventh switching device S7. The potential of the first bit line 5a is $V_P+\Delta V$, and the charging voltage $\Delta V$ of the step-up capacitor C1 is applied in the positive with respect to the sense amplifier 7. Therefore, the potential of the first output terminal 16a of the sense amplifier 7 becomes $(V_P+\Delta V)+\Delta V=V_P+2\Delta V$. On the other hand, by conduction of the eighth and ninth switching devices S8 and S9, the second output terminal 16b of the sense amplifier 7 is connected in series with the second bit line 5b through the step-down capacitor C3, the ninth switching device S9, the step-down capacitor C2 and the eighth switching device S8. The potential of the second bit line 5b is $V_P$ and charging voltages of both step-down capacitors C2 and C3 are $\Delta V$, with a composite voltage thereof being $2\Delta V$. A direction of application of the composite voltage $\Delta V$ is negative with respect to the sense amplifier 7. Therefore, the potential of the second output terminal 16b of the sense amplifier 7 becomes $V_P-2\Delta V$.

As a result, an initial potential difference between the bit lines to be amplified by the sense amplifier 7 is $(V_P+2\Delta V)-(V_P-2\Delta V)=4\Delta V$. More specifically, the potential difference $\Delta V$ between the bit lines produced for applying the reading signal is amplified fourfold and then inputted to the sense amplifier 7.

Therefore, even though a cell area becomes small due to a large scale of integration and the capacitance $C_S$ of a capacitor is reduced, or the number of memory cells connected to the bit lines is increased to cause an increase in the stray capacitance $C_B$ of a bit line, resulting in a decrease in the potential difference $\Delta V$ at the time of reading, operation of the sense amplifier 7 can be performed reliably and malfunction thereof does not occur, because the value $\Delta V$ is amplified fourfold and inputted to the sense amplifier 7.

Consequently, it becomes possible to avoid the disadvantages involved in the prior art, such as complication of a manufacturing process because of a deepened trench of a capacitor due to an increase in capacitor capacitance, or enlargement of a chip area caused by the necessity of providing a sense amplifier in each divided section of a memory cell array to shorten each bit line to reduce bit line stray capacitance.

Operation after time t4 is almost the same as conventional operation. When the clock signal $\phi 1$ falls to 0 V and the clock signal $\phi 2$ rises to $V_{CC}$ at the time t4, the Nch-MOSFET 8b of the sense amplifier 7 and Pch-MOSFET 10a are turned on if $\Delta V$ is positive. As a result, the first input terminal 16a is charged to a supply potential $V_{CC}$ and the second input terminal 16b is discharged to 0 V. On the other hand, the Nch-MOSFET 8a of the sense amplifier 7 and the Pch-MOSFET 10b are turned on if case $\Delta V$ is negative. As a result, the first input terminal 16a is designated to 0 V and the second input terminal 16b is charged to the supply potential $V_{CC}$. Subsequently, at time t5, the clock signal $\phi 3$ rises to "H" level and the clock signal $\phi 4$ falls to "L" level. Then, the first to sixth switching devices S1 to S6 are turned on and the seventh to ninth switching devices S7 to S9 are turned off. As a result, the potential of the first bit line 5a becomes the supply potential $V_{CC}$ (if $\Delta V$ is positive) or 0 V (if $\Delta V$ is negative), with the result that the initial contents are rewritten in the capacitor cell 3a. Then, at time t6, the word line 6a falls to "L" level and a MOSFET 4a of the memory cell 2a is turned off, whereby the initial state is set again.

At the time of the initial amplification of the sense amplifier 7, since the potential of the first bit line 5a is $V_P+\Delta V$ and the potential of the second bit line 5b is $V_P$ when $\Delta V$ is positive in the conventional example shown in FIG. 1, voltages between sources and gates of the Nch-MOSFET's 8a and 8b become $V_{thN}$ and $\Delta V+V_{thN}$, respectively, and then the Nch-MOSFET 8b is turned on, while voltages between sources and gates of the Pch-MOSFET's 10a and 10b become $-|V_{thP}|$ and $|\Delta V-|V_{thP}||$), respectively, and then both are not turned on. By contrast, in this embodiment, since the potential of the first input terminal 16a is $V_P+2\Delta V$ and the potential of the second input terminal 16b is $V_P-2\Delta V$, voltages between sources and gates of the Pch-MOSFET's 10a and 10b become $-(2\Delta V+|V_{thP}|)$ and $(2\Delta V-|V_{thP}|)$, respectively, and then the Pch-MOSFET 10a is turned on and Pch-MOSFET 10b is turned off. More specifically, at the time of initial amplification of a sense amplifier, the latch circuit comprising Nch-MOSFET's 8a and 8b and the latch circuit comprising Nch-MOSFET's 10a and 10b are both operated, which involves an advantage that sense operation can be performed at high speed. Even when $\Delta V$ is negative, sensing operation can be also performed at high speed in the sense manner as described above.

Furthermore, the present invention is not limited to the circuit structure shown in FIG. 5 as a preamplifier and any structure is applicable if a voltage is boosted for one input terminal of the sense amplifier and dropped for the other input terminal of the sense amplifier in accordance with a potential difference produced between both bit lines at the time of applying a reading signal. In addition, a potential difference between bit lines needs not be amplified fourfold and the amplifying factor may be determined corresponding to a scale of integration. In addition, the numbers of the step-up capacitors and the step-down capacitors can be arbitrary determined. However, it is preferred that the number of the step-down capacitors is twice as many as that of step-up capacitors. In such a time, a raised value of one input terminal of the sense amplifier can be substantially equal to a lowered value of the other one input terminal.

For a sense amplifier, the one whose operation speed is increased by amplification of a voltage difference between bit lines is preferred but it is not limited thereto. In addition, although Nch-MOSFET's are employed in a memory cell and a preamplifier, Pch-MOSFET's may be used with a negative phase clock.

Although description was given of a DRAM having folded bit line structure in the above described embodiment, it goes without saying that the present invention can be applied to a DRAM having open bit line structure.

According to the above described embodiment, the potential difference applied to the sense amplifier through the bit line can be increased without increasing the storage capacitance of the memory cell, and without reducing the stray capacitance of the bit line. Therefore, the malfunction of the sense amplifier can be prevented and the reliability of data read out of DRAM can be improved without complicating the manufacturing process and without increasing the chip area. In addition, according to the above described embodiment, the bit line voltage applied to the sense amplifier can be amplified symmetrically with the precharge voltage being the center, whereby the sense operation of the sense amplifier can be carried out at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array having a plurality of word lines, a plurality of bit lines arranged in a crossed manner at right angles with said word lines and a plurality of memory cells arranged at intersections between said word lines and bit lines,
   said bit lines being first bit lines and second bit lines which constitute a plurality of bit line pairs, respectively;
   a plurality of sense amplifiers connected between said first bit lines and said second bit lines of said bit line pairs lead from said memory cell array to amplify a potential difference produced between said first and second bit lines at the time of applying a reading signal to said memory cells through said word lines and to assure a level of rewriting into said memory cells after reading; and
   a preamplifier provided between said memory cell array and each said sense amplifier to amplify a potential difference produced between said first and second bit lines at the time of applying said reading signal and to output the amplified potential difference to the corresponding one of said sense amplifiers,
   each said preamplifier comprising a step-up capacitor for raising a potential of said corresponding first bit line, a step-down capacitor for lowering potential of said corresponding second bit line, first switching means for connecting said step-up capacitor and said step-down capacitor between said first bit line and said second bit line, and second switching means for connecting in series said step-up capacitor to one input terminal of said sense amplifier in a positive direction and for connecting in series said step-down capacitor to the other input terminal of said sense amplifier in a negative direction,
   the number of said step-down capacitors being selected to be twice as many as that of said step-up capacitors.

2. A semiconductor memory device in accordance with claim 1, wherein each said sense amplifier comprises a CMOSFET.

3. A semiconductor memory device in accordance with claim 2, wherein each said sense amplifier comprises a first latch circuit comprising a P channel MOSFET and a second latch circuit comprising an N channel MOSFET interconnected with each other.

4. A semiconductor memory device comprising:
   a memory cell array having a plurality of word lines, a plurality of bit lines arranged in a crossed manner at right angles with said word lines and a plurality of memory cells arranged at intersections between said word lines and bit lines,
   said bit lines being first bit lines and second bit lines which constitutes a plurality of bit line pairs, respectively;
   a plurality of sense amplifiers connected between said first bit lines and said second bit lines of said bit line pairs lead from said memory cell array to amplify a potential difference produced between said first and second bit lines at the time of applying a reading signal to said memory cell through said word lines and to assure a level of rewriting into said memory cells after reading; and
   a preamplifier provided between said memory cell array and each said sense amplifier to amplify a potential difference produced between said first and second bit lines at the time of applying said reading signal and to output the amplified potential difference to the corresponding one of said sense amplifiers; wherein
   each of said preamplifiers comprises first means for increasing the potential of one of said first and second bit lines by a first level, and second means for reducing the potential of the other one of said first and second bit lines by a second level, and
   the absolute value of said first level is selected to be twice the absolute value of said second level.

5. In a semiconductor memory device comprising:
   a memory cell array having a plurality of word lines, a plurality of bit lines arranged in a crossed manner at right angles with said word lines and a plurality of memory cells arranged at intersections between said word lines and bit lines,
   said bit lines being first bit lines and second bit lines which constitute a plurality of bit line pairs, respectively;
   a plurality of sense amplifiers connected between said first bit lines and said second bit lines of said bit line pairs lead from said memory cell array to amplify a potential difference produced between said first and second bit lines at the time of applying a reading signal to said memory cells through said word lines and to assure a level of rewriting into said memory cells after reading; and
   a preamplifier provided between said memory cell array and each said sense amplifier to amplify a potential difference produced between said first and second bit lines at the time of applying said reading signal and to output the amplified potential difference to the corresponding one of said sense amplifiers;
   a method of preamplification comprising the steps of:
   increasing potential of one of said first and second bit lines by a first level by said preamplifier; and
   reducing potential of the other one of said first and second bit lines by a second level by said preamplifier; wherein
   the absolute value of said first level is selected to be twice the absolute value of said second level.

* * * * *